(12) United States Patent
Dathe et al.

(10) Patent No.: US 6,798,188 B2
(45) Date of Patent: Sep. 28, 2004

(54) VOLTAGE PEAK MEASUREMENT WITH DIGITAL MEMORY

(75) Inventors: Lutz Dathe, Dresden (DE); Wolfram Kluge, Dresden (DE); Thorsten Riedel, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 10/284,643

(22) Filed: Oct. 31, 2002

(65) Prior Publication Data

US 2004/0041555 A1 Mar. 4, 2004

(30) Foreign Application Priority Data

Aug. 29, 2002 (DE) .......................................... 102 39 859

(51) Int. Cl.[7] .......................... G01R 19/30; G01R 19/00
(52) U.S. Cl. ............................... 324/103 P; 324/103 R; 324/158.1; 341/120; 341/155
(58) Field of Search ........................... 324/76.55, 76.82, 324/99 D, 103 R, 103 P, 158.1; 702/65–69, 198; 341/118, 120, 155–156, 165

(56) References Cited

U.S. PATENT DOCUMENTS

| | | | |
|---|---|---|---|
| 3,636,555 A | * 1/1972 | Waaben | 341/156 |
| 4,456,904 A | * 6/1984 | van de Grift | 341/156 |
| 5,121,119 A | * 6/1992 | Higuchi et al. | 341/120 |
| 5,990,814 A | * 11/1999 | Croman et al. | 341/118 |
| 6,242,900 B1 | * 6/2001 | Fawcett et al. | 324/76.65 |
| 6,445,320 B1 | 9/2002 | Noro et al. | |

FOREIGN PATENT DOCUMENTS

DE 19536819 3/1997

* cited by examiner

*Primary Examiner*—Minh N. Tang
(74) *Attorney, Agent, or Firm*—Meyertons Hood Kivlin Kower & Goetzel, P.C.; B. Noël Kivlin

(57) ABSTRACT

A technique for measuring peak voltages is provided that may be used in RF transceivers or receivers of wireless local area network systems. In an apparatus for measuring a peak value of an analog voltage, an analog to digital converter is connected to receive an input voltage. A voltage level detection unit detects a voltage level of a received input voltage, and a digital memory receives and stores the detected voltage level. The digital memory updates the stored voltage level only if the currently detected voltage level is higher, or lower, than the stored level. A digital code is output that corresponds to the stored voltage level. The provided technique may allow for a more simple and less complex implementation.

39 Claims, 5 Drawing Sheets

VOLTAGE PEAK MEASUREMENT WITH DIGITAL MEMORY

BACKGROUND OF THE INVENTION

1. Field of the Invention

The invention generally relates to voltage peak measurement apparatus and methods and in particular to such voltage peak measurement techniques that may be used in units or subunits of communication systems such as WLAN (Wireless Local Area Network) systems.

2. Description of the Related Art

A wireless local area network is a flexible data communication system implemented as an extension to, or as an alternative for, a wired LAN. Using radio frequency (RF) or infrared technology, WLAN systems transmit and receive data over the air, minimizing the need for wired connections. Thus, WLAN systems combine data connectivity with user mobility. Most WLAN systems use spread spectrum technology, a wide-band radio frequency technique developed for use in reliable and secure communication systems. The spread spectrum technology is designed to trade-off bandwidth efficiency for reliability, integrity and security.

One element in wireless communication systems are RF transceivers. Today, RF transceivers are often provided as integrated circuits and the realization of RF transceivers in highly integrated circuits may be a requirement for applications such as those in wireless local area networks and in the cellular telephony to achieve a very high dynamic range and a very high frequency on the one hand and a low power consumption and a reduction in the passive components on the other hand.

FIG. 1 shows a typical configuration of a conventional voltage peak measurement apparatus that detects peak values of an analog signal ($V_{in}$) and outputs digital results corresponding to the detected peak values. The peak measurement configuration of FIG. 1 comprises an analog to digital converter 100, a reference voltage source 130, a capacitor 160, a diode 190 and a reset switch 150 connected to discharge the capacitor 160.

The analog to digital converter 100 is a known device that comprises different input terminals 120, 140. A first input terminal is a peak voltage input terminal 140 that is connected to receive the peak voltage ($V_{peak}$) of the analog signal ($V_{in}$) applied to the input terminals 170, 180 of the peak measurement configuration.

A second input terminal is a reference voltage input terminal 120. The reference voltage input terminal 120 is connected to a reference voltage source 130 to provide a reference voltage ($V_{ref}$). As shown in FIG. 1, the other side of the reference voltage source 130 is connected to a common ground line that is further connected to the input terminal 180.

A further input terminal of the conventional analog to digital converter 100 is a clock terminal 110 to receive an external clock signal that may be used to synchronize internal devices of the analog to digital converter 100.

As mentioned above, the input terminal 170 of the peak measurement configuration is connected to the peak voltage input terminal 140 of the analog to digital converter 100. This connection is referred to as an input line hereafter. Between the input line and the common ground line, there are the capacitor 160 and the reset switch 150 connected in parallel thereto.

The terminal 140 receives a rectified analog voltage signal, and also the capacitor 160 receives the applied rectified analog voltage. The capacitor 160 is charged and holds a voltage corresponding to the currently applied analog voltage. This held voltage is a peak voltage of the applied analog voltage and the analog to digital converter 100 converts the held peak voltage into digital data.

The peak measurement configuration of FIG. 1 has several disadvantages. In particular, the usage of the capacitor 160 and the reset switch 150 for discharging the capacitor 160 is disadvantageous. Referring to the signal graphs of FIG. 2, the function of the conventional peak measurement configuration of FIG. 1 will be explained in more detail and the disadvantages will be pointed out. FIG. 2 illustrates an example of an input signal received at the input terminals 170, 180 of the peak measurement configuration of FIG. 1. Further, a reset signal is illustrated that indicates when the reset switch 150 of the peak measurement configuration of FIG. 1 discharges the capacitor 160.

After the reset switch 150 is turned off, the discharged capacitor 160 is then ready to store a voltage peak of the applied input signal. The signal graphs of FIG. 2 show that the falling edge 230 of the reset signal initiates the charging of the capacitor 160. The capacitor 160 holds the first voltage peak 240 of the input signal as long as a further, higher voltage peak 250, 260 is applied, or until the capacitor 160 is discharged by the reset switch 150. Thus, the capacitor voltage represents the maximum of the input voltage ($V_{in}$) since the last reset, thus the input voltage peak.

When the capacitor 160 holds a voltage level, the connected analog to digital converter 100 generates a digital output corresponding to the held voltage level.

It is well known that each capacitor discharges due to leak currents. This process of discharging effects an error 220 that decreases the currently stored peak voltage level 260 over time. The decreased peak voltage level is delivered to the analog to digital converter 100, and the analog to digital converter 100 generates output data that does not represent the original peak voltage level of the analog voltage applied to the peak measurement configuration of FIG. 1 but the decreased level.

Assuming the capacitor of FIG. 1 receives a rectified voltage signal that is generated by an input circuit that comprises a diode and a current source for generating a bias current for keeping the diode at a given operating point in forward direction, the current source will effect a further decrease of the stored voltage level of the capacitor 160 in addition to the above-described discharging effect because the current of the current source may speed up the discharging of the capacitor 160.

A further disadvantage of the conventional configuration of FIG. 1 is the fact that discharging the capacitor 160 introduces a time dependent error. Therefore, it is necessary to balance between measurement time, discharge of the capacitor 160 and, in case of a rectified signal, the bias current of the diode for rectifying, to minimize operating point dependent errors and to provide the needed signal bandwidth.

The above-described effects are difficult to balance and decrease the available signal bandwidth. Further, the disadvantages lead to a decreased operating speed of the peak measurement configuration and result in less precision and less accuracy.

SUMMARY OF THE INVENTION

An improved voltage peak measurement apparatus, an integrated circuit chip, a WLAN receiver and an operation method are provided for performing a voltage peak measurement that may allow for high operating speed, high precision and high accuracy.

In one embodiment, there is provided a voltage peak measurement apparatus for measuring a peak value of an analog voltage. The apparatus comprises an analog to digital converter that is connected to receive an input voltage. The analog to digital converter comprises a voltage level detection unit that is adapted to detect a voltage level of the received input voltage, and a digital memory that is connected to the voltage level detection unit for receiving and storing the detected voltage level. The digital memory is adapted for updating the stored voltage level by a currently detected voltage level only if the currently detected voltage level is higher than the stored voltage level, or updating the stored voltage level by a currently detected voltage level only if the currently detected voltage level is lower than the stored voltage level. The digital memory is capable of outputting a digital code that corresponds to the stored voltage level.

In a further embodiment, an integrated circuit chip has circuitry for measuring a peak value of an analog voltage. The integrated circuit chip comprises an analog to digital converter circuit that is connected to receive an input voltage. The analog to digital converter circuit comprises a voltage level detection circuit that is adapted to detect a voltage level of the received input voltage, and a digital memory circuit that is connected to the voltage level detection circuit for receiving and storing the detected voltage level. The digital memory circuit is adapted for updating the stored voltage level by a currently detected voltage level only if the currently detected voltage level is higher than the stored voltage level, or updating the stored voltage level by a currently detected voltage level only if the currently detected voltage level is lower than the stored voltage level. The digital memory circuit is capable of outputting a digital code that corresponds to the stored voltage level.

In another embodiment, there is provided a WLAN receiver that has a voltage peak measurement device for measuring a peak value of an analog voltage. The device comprises an analog to digital converter that is connected to receive an input voltage. The analog to digital converter comprises a voltage level detection unit that is adapted to detect a voltage level of the received input voltage, and a digital memory that is connected to the voltage level detection unit for receiving and storing the detected voltage level. The digital memory is adapted for updating the stored voltage level by a currently detected voltage level only if the currently detected voltage level is higher than the stored voltage level, or updating the stored voltage level by a currently detected voltage level only if the currently detected voltage level is lower than the stored voltage level. The digital memory is capable of outputting a digital code that corresponds to the stored voltage level.

In yet another embodiment, there is provided a method of measuring a peak value of an analog voltage. The method comprises receiving an input voltage in an analog to digital converter, detecting a voltage level of the received input voltage, storing the detected voltage level in a digital memory, and outputting a digital code that corresponds to the stored voltage level. The stored voltage level is updated by a currently detected voltage level only if the currently detected voltage level is higher than the stored voltage level, or the stored voltage level is updated by a currently detected voltage level only if the currently detected voltage level is lower than the stored voltage level.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following, and more particular description of the invention as illustrated in the accompanying drawings, wherein.

DETAILED DESCRIPTION OF THE INVENTION

The illustrative embodiments of the present invention will be described with reference to the figure drawings, wherein like elements and structures are indicated with like reference numbers.

Figure 1:
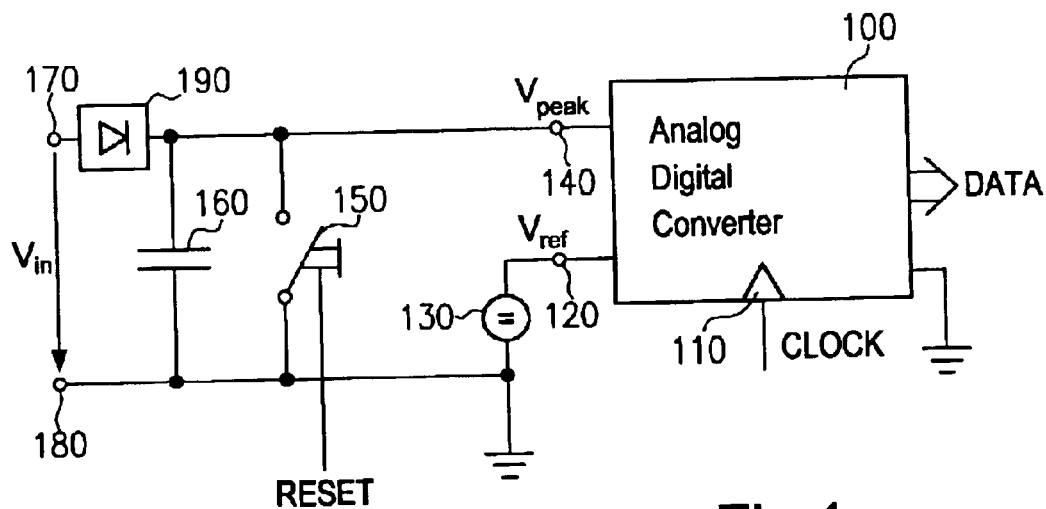
FIG. 1 shows a typical configuration for measuring voltage peak values.
Figure 2:
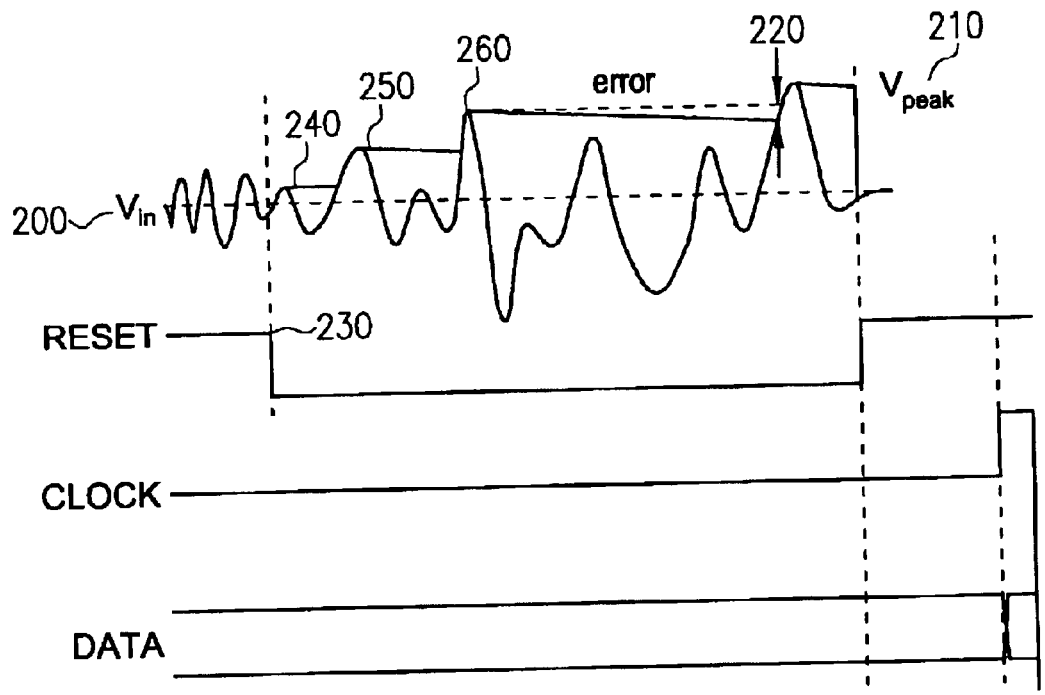
FIG. 2 shows an example of input signals applied to the configuration of FIG. 1.
Figure 3:
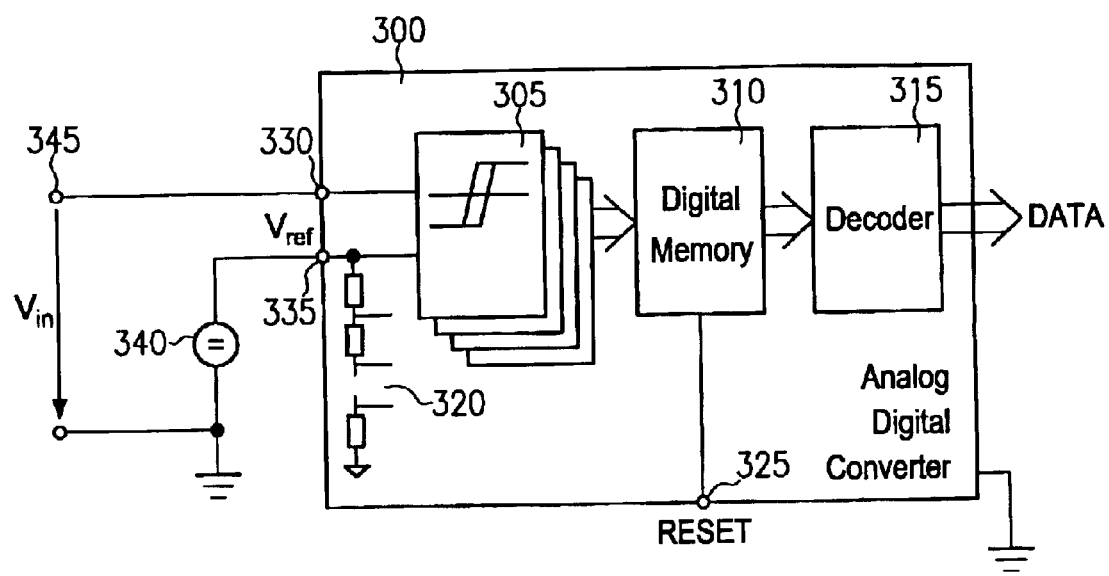
FIG. 3 is a block diagram of a voltage peak measurement apparatus according to an embodiment.

Referring now to the drawings, in particular to FIG. 3, a block diagram of a voltage peak measurement apparatus is depicted for measuring a peak value of an analog voltage ($V_{in}$). According to one embodiment, the apparatus comprises an analog to digital converter 300 and an input circuit that is connected to the analog to digital converter to provide the analog voltage ($V_{in}$) and a reference voltage ($V_{ref}$).

The analog to digital converter shown in FIG. 3 comprises a voltage level detection unit 305 that is connected to a first input terminal 330 to receive an input voltage. The voltage level detection unit 305 is adapted to detect a voltage level of the received input voltage by comparing the input voltage with predefined reference voltages. As shown in the figure, a second input terminal 335 of the analog to digital converter 300 is connected to a reference voltage source 340 and is further connected to a reference divider 320 for generating the predefined reference voltages based on the input reference voltage ($V_{ref}$). The reference divider 320 is arranged to provide the generated reference voltages to the voltage level detection unit 305.

The voltage level detection unit 305 in the current embodiment of FIG. 3 comprises a plurality of threshold switches to detect a voltage level of the received input voltage ($V_{in}$), wherein the above-mentioned generated reference voltages define the threshold voltages for the threshold switches. The threshold switches detect a voltage level when the received input voltage ($V_{in}$) exceeds respective thresholds, and the connected digital memory 310 holds this status. Once the digital memory stores the data indicating that an individual threshold was exceeded, this data is held even if the input voltage drops below the respective threshold. The threshold switches may be Schmitt-Trigger devices. The threshold switches detect a voltage level when the received input voltage ($V_{in}$) exceeds respective thresholds, and the connected digital memory 310 holds this status. Once the digital memory stores the data indicating that an individual threshold was exceeded, this data is held even if the input voltage drops below the respective threshold.

The digital memory 310 is adapted for storing a currently detected voltage level and for updating a stored voltage level with the currently detected voltage level. The memory updates the stored voltage level by a currently detected voltage level only if the currently detected voltage level is higher than the stored voltage level, or updates the stored voltage level by a currently detected voltage level only if the currently detected voltage level is lower than the stored voltage level.

In the present embodiment, the digital memory 310 comprises a plurality of latch flip flop units, wherein each of the latch flip flop units is connected to a threshold switch of the voltage level detection unit 305 to receive a voltage level related bit. This voltage level related bit comprises the information whether the applied input voltage of the analog to digital converter 300 has exceeded the respective threshold, or not.

The digital memory 310, and therefore the latch flip flop units, are resettable by a reset signal received at a reset terminal 325. The latch flip flop units of the digital memory 310 store the above-mentioned voltage level related bits by switching the related latch flip flop units.

The stored bits in the digital memory form a digital code that represents the currently detected voltage level. This digital code is transferred to a connected decoder unit 315, and the decoder unit 315 generates digital output data of the voltage peak measurement apparatus.

In the following, the function of the above-described analog to digital converter 300 will be described in more detail with reference to FIG. 4. It can be seen that the embodiment of FIG. 4 differs from that of FIG. 3 in the input circuit that is connected to the analog to digital converter 300. The terminal 420 receives an analog voltage, and a diode 410 is provided to rectify the received analog voltage so that negative voltages are cut off. This rectified analog voltage is delivered to the analog to digital converter 300.

The input circuit further comprises a current source 400 that is connected to the diode 410 and a ground line of the input circuit. The current source 400 is adapted to generate a forward bias current for keeping the diode 410 at a defined operating point.

The reference voltage source 340 is connected to the ground line of the input circuit and further to the reference voltage input terminal 335 of the analog to digital converter 300 to deliver a reference voltage to the divider unit 320. The divider unit 320 is provided for dividing the input reference voltage of the reference voltage source 340 into predefined voltages to provide threshold voltages for the threshold switches in the voltage level detection unit 305.

Figure 4:
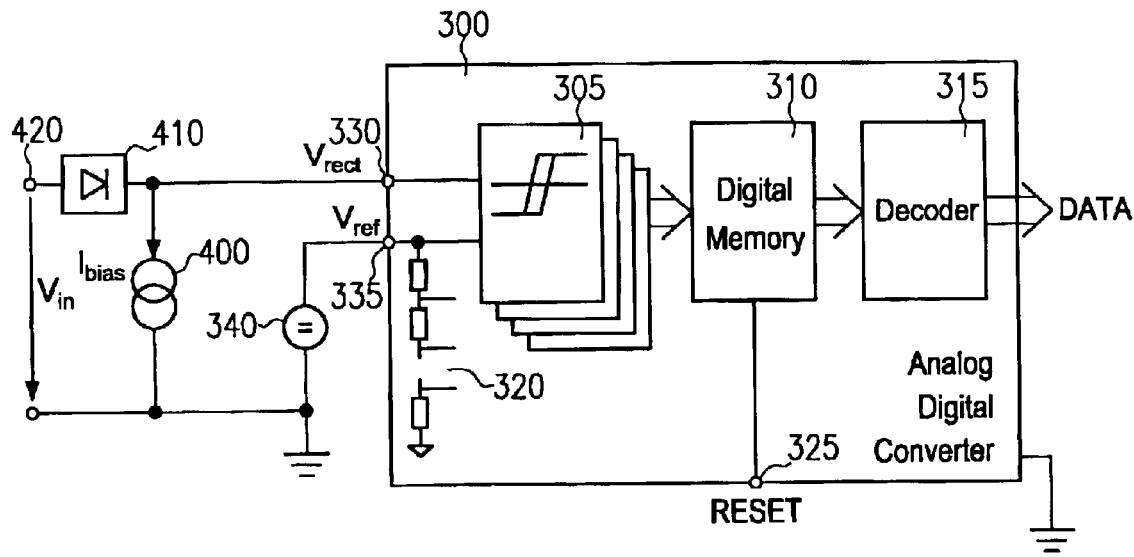
FIG. 4 is a block diagram of a voltage peak measurement apparatus according to another embodiment that comprises an input circuit.
Figure 5:
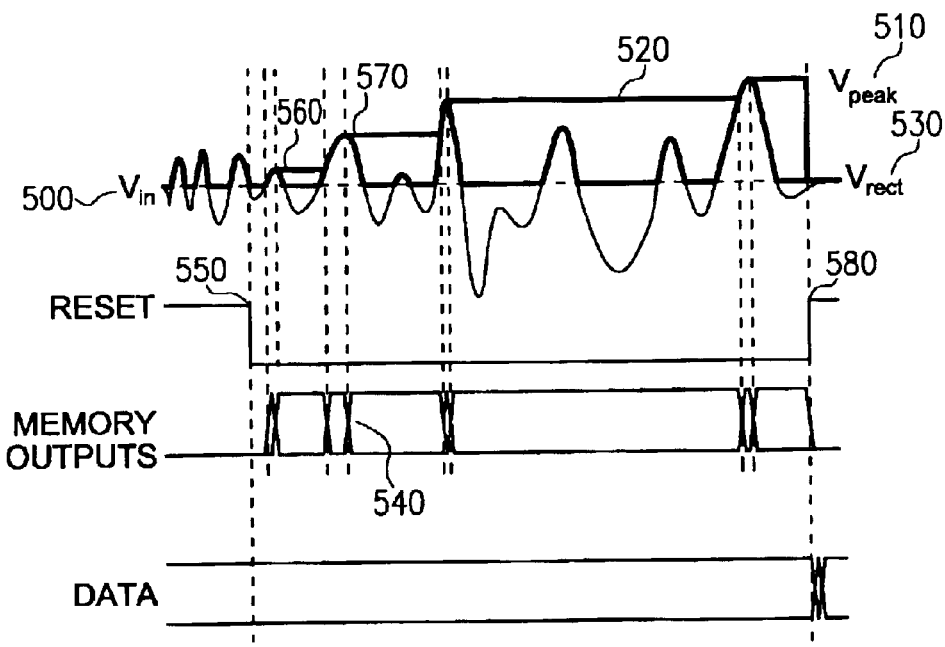
FIG. 5 shows an example of input signals applied to the voltage peak measurement apparatus of FIG. 4.

The function of the voltage peak measurement apparatus that uses a rectifier as shown in FIG. 4 will be explained in the following with reference to the illustrated signal graphs of FIG. 5.

One curve shown in the upper most signal graph is an example of the analog voltage 500 ($V_{in}$) that is applied to the input circuit of FIG. 4. Another curve illustrates the rectified voltage 530 $V_{rect}$) that is input to the analog to digital converter 300. Further, a peak voltage curve 510 ($V_{peak}$) is shown that indicates the value of the digital output signal of the digital memory 310. Moreover, a reset signal is depicted as well as the digital representation 540 of the output signal of the digital memory 310 and the data output of the voltage peak measurement apparatus.

The falling edge 550 of the reset signal terminates the reset state of the digital memory 310 of the analog to digital converter 300. The voltage level detection unit 305 starts detecting for a first voltage peak level 560 of the rectified analog input signal ($V_{rect}$). The first voltage peak level 560 is kept by the digital memory 310 as long as a higher voltage level 570 is detected. Once the level has been updated to the voltage level 570, this is kept as long as a further, even higher voltage level 520 is detected. This process continues as long as no higher voltage level is detected. The mentioned process continues until a rising edge 580 of the reset signal 500 is received. In another embodiment, the process is independent of the rising edge.

The digital memory 310 receives the currently detected voltage as a digital code. This digital code is kept by the digital memory if the voltage is higher than the previously stored voltage, and output to the decoder unit 315. The digital code may be output simultaneously with each update.

The decoder 315 generates digital data from the received digital code by decoding the code. In an embodiment, the rising edge 580 of the reset signal initiates an outputting of the generated digital data as a digital output signal of the peak value measurement apparatus.

Figure 6:
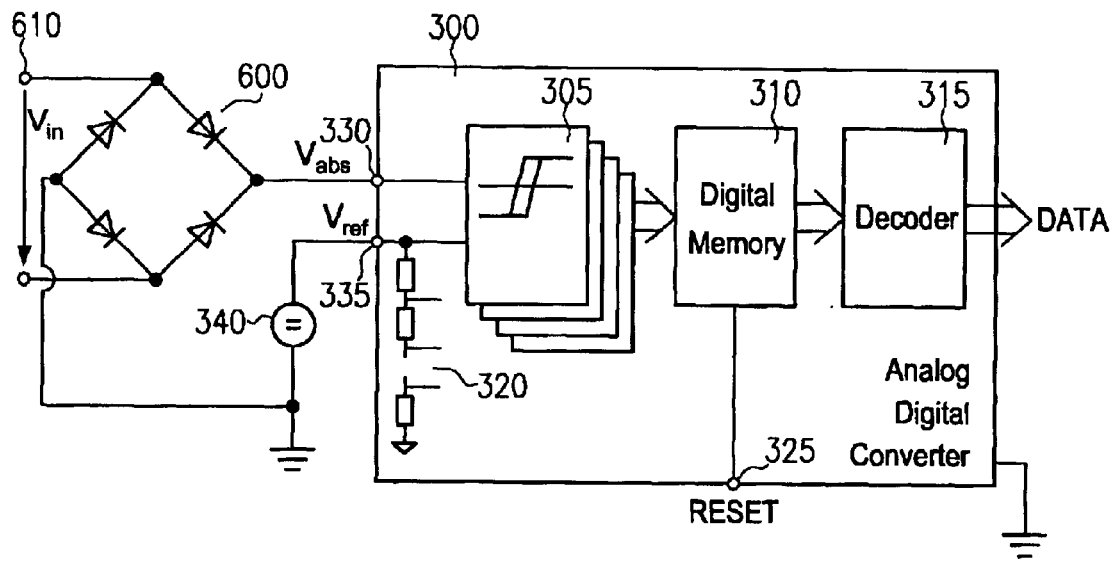
FIG. 6 is a block diagram similar to that of FIG. 4 with a different input circuit according to a further embodiment.

A further embodiment of the voltage peak measurement apparatus is depicted in FIG. 6. The apparatus of FIG. 6 differs from the above-described embodiment of FIG. 4 in the construction of the input circuit that provides the input voltage to the analog to digital converter 300 and in the realization of the voltage level detection unit 305.

The input circuit of the present embodiment of FIG. 6 is an absolute value generator which receives an analog voltage ($V_{in}$) at the input terminals 610 of the voltage peak measurement apparatus. The absolute value generator comprises a diode bridge circuit 600 that is connected to an absolute value input terminal 330 of the analog to digital converter 300.

The devices used in the voltage level detection unit 305 of the present embodiment may differ from the above embodiments of FIG. 4. The construction of the voltage level detection unit 305 will be discussed in more detail in the following.

The absolute value input terminal 330 of the analog to digital converter 300 is connected to the voltage level detection unit 305 that comprises a plurality of comparator devices, wherein each of the comparator devices is connected to receive the absolute value input signal ($V_{abs}$). Each of the comparator units is further connected to the divider unit 320 to receive an individual divider voltage.

The output terminals of the comparator units are connected to the digital memory 310 for delivering the comparator results. As described above, the digital memory 310 comprises a reset terminal for receiving a reset signal and the digital memory 310 is connected to the decoder unit 315 for delivering the digital code related to the detected voltage peak level. In another embodiment, the decoder unit 315 generates digital output data to be output when a rising edge is received at the reset terminal 325.

Figure 7:
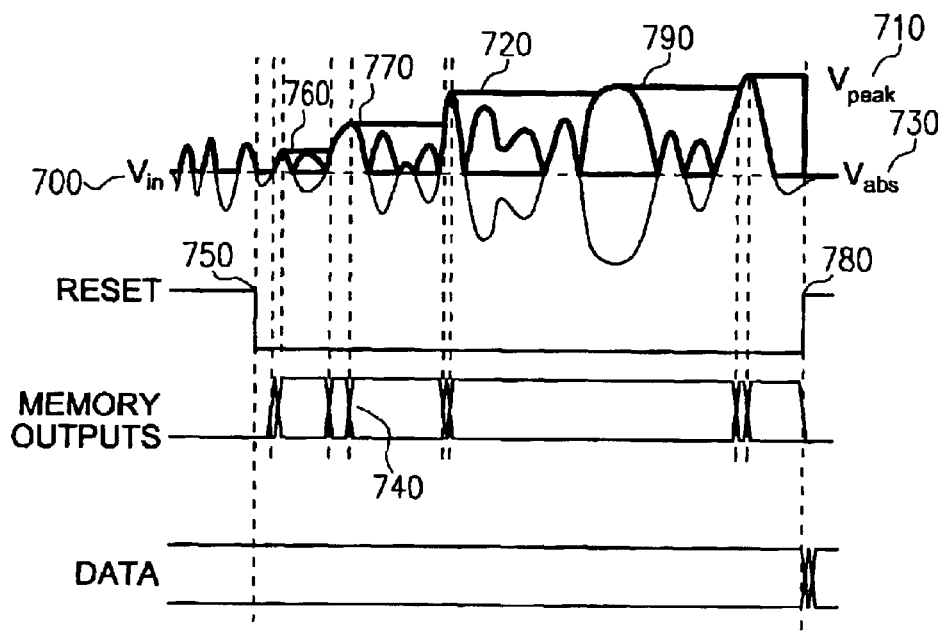
FIG. 7 shows an example of input signals applied to the voltage peak measurement apparatus of FIG. 6.

It will be referred in the following to the signal graphs of FIG. 7 in order to describe the embodiment of FIG. 6 in more detail. The signals of FIG. 7 differ from those of FIG. 5 mainly in that absolute values 730 ($V_{abs}$) are input to the analog to digital converter 300 rather than rectified voltages. That is, the analog to digital converter 300 receives only positive voltages.

As mentioned above, the voltage level detection unit 305 in the embodiment of FIG. 6 comprises a plurality of comparator units for detecting a voltage peak level of the received input voltage($V_{abs}$), wherein the received input voltage will be compared with the above-mentioned reference voltages that are predefined by the divider unit 320.

Each of the comparator units outputs a comparator result that corresponds to one of the predefined reference voltages that are provided by the divider unit 320 and that each represent a bit of the currently detected voltage level. The comparator results are transferred to the digital memory 310 that holds the comparison results as a digital code if the results indicate that a previously stored peak value has been exceeded.

Simultaneously, the digital memory 310 transmits the corresponding digital code to the decoder unit 315. This is shown in FIG. 7 where the memory output changes whenever the voltage peak is updated. That is, each new voltage level that is higher than the previously detected voltage level causes a digital output signal to the decoder unit 315. In the present embodiment, the decoder unit 315 generates then the digital output of the voltage peak measurement apparatus.

In another embodiment, the analog to digital converter detects for a higher voltage level until the rising edge 780 of the reset signal is received. If the rising edge 780 of the reset signal is received, the decoder unit 315 generates the digital output of the voltage peak measurement apparatus.

Figure 8:
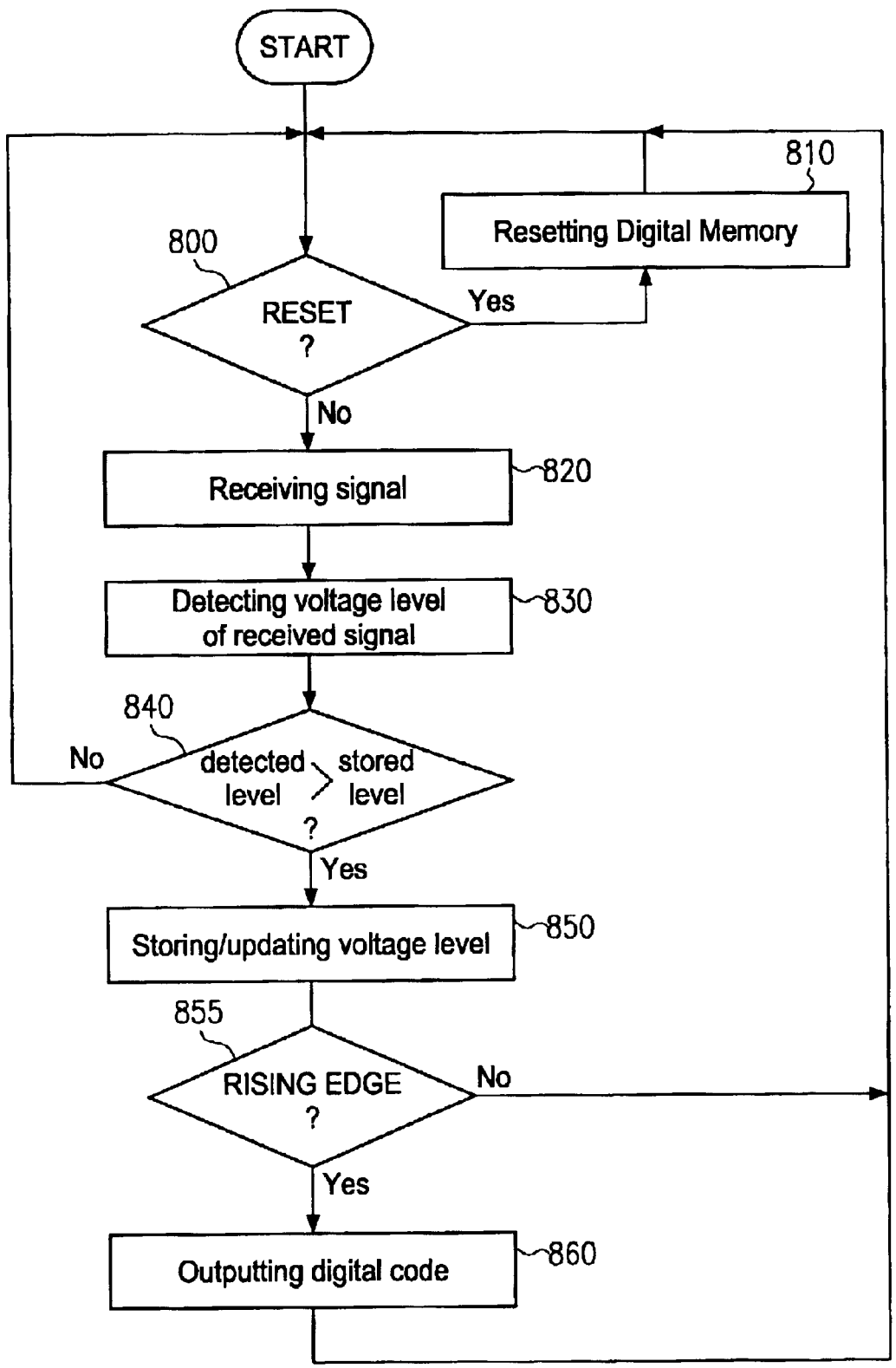
FIG. 8 is a flow chart illustrating the process of measuring voltage peaks using the apparatus according to one of the embodiments.

Turning now to FIG. 8, a flow chart of the process of measuring voltage peaks according to an embodiment is depicted. Because of the fact that the above described voltage peak measurement apparatus start measuring the voltage peaks with a falling edge of the reset signal, the reset signal is detected in step 800.

If the reset signal has a high level, the digital memory is reset in step 810. If the reset signal has a falling edge, the voltage peak measurement apparatus is prepared for detecting voltage peaks and receives a signal in step 820. The voltage level of the received signal is than detected in step 830. The currently detected voltage level is now compared with a previously stored voltage level in step 840. If the currently detected voltage level is greater than the previously stored voltage level, the new voltage level is stored in step 850. That is, the previously stored voltage level is updated by the currently detected voltage level in step 850. The stored or updated voltage level is than output as a digital code in step 860. After outputting the digital code in step 860, the process of measuring the voltage peaks returns to continue detecting.

However, if the detected voltage level is lower than the previously stored voltage level, the process of measuring the voltage peaks will reiterate starting from step 840.

As apparent from the foregoing description, all of the embodiments as described may advantageously provide high accuracy, high precision and increased operating speed, because the usage of the capacitor 160 is avoided. Moreover, this provides the advantage that no time dependent error is introduced that caused in the prior art systems by charging and discharging the capacitor 160. This facilitates the timing processes since no time delay exist.

Further, the embodiment may even be used in systems where data acquisition is driven by an asynchronous timing.

The provided interconnection of the absolute value generator and the analog to digital converter 300 described in the embodiment above may offer additional advantages.

Storing the voltage peaks by a built-in digital memory 310, and in particular by means of latch flip flop units, may further provide the advantage that the stored voltage level is kept absolutely stable independently of leak currents or other disturbances. This makes it possible to keep acquisition errors in a reasonable range.

The arrangements may further have the advantage to provide a higher bandwidth because no charging and discharging of capacitors is required. Moreover, data acquisition may be finished immediately after the respective measurement period. Any power dissipation is reduced as far as possible.

Moreover the manufacturing may be simplified because the arrangements use a decreased number of component parts. Therefore, the above-described embodiments may, in effect, reduce the production costs.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. For instance, while the above embodiments have been described as detecting positive voltage peaks, other embodiments may be provided for detecting negative peaks in much the same way as discussed above.

In addition, those areas in which it is believed that those of ordinary skill in the art are familiar, have not been described herein in order not to unnecessarily obscure the invention described herein. Accordingly, it is to be understood that the invention is not to be limited by the specific illustrative embodiments, but only by the scope of the appended claims.

What is claimed is:

1. A voltage peak measurement apparatus for measuring a peak value of an analog voltage, the apparatus comprising an analog to digital converter connected to receive an input voltage, said analog to digital converter comprising:

a voltage level detection unit adapted to detect a voltage level of a received input voltage; and a digital memory connected to the voltage level detection unit for receiving and storing a detected voltage level;

wherein said digital memory is adapted for updating a stored voltage level by a currently detected voltage level only if the currently detected voltage level is higher than the stored voltage level, or updating the stored voltage level by a currently detected voltage level only if the currently detected voltage level is lower than the stored voltage level;

wherein said digital memory is capable of outputting a digital code corresponding to the stored voltage level.

2. The apparatus of claim 1, wherein said digital memory is resettable, and comprises a reset terminal for receiving a reset signal.

3. The apparatus of claim 1, wherein said digital memory comprises at least one latch flip flop unit adapted for storing a voltage level.

4. The apparatus of claim 1, wherein said digital memory comprises a plurality of latch flip flop units, wherein each of said latch flip flop units corresponds to a different voltage level of said input voltage, and the digital memory is adapted for switching a state of at least one of the latch flip flop units corresponding to said input voltage, and holding the states of the latch flip flop units as long as no reset signal is received.

5. The apparatus of claim 4, wherein said plurality of latch flip flop units are adapted for outputting said digital code each time a voltage level is stored.

6. The apparatus of claim 4, wherein said latch flip flop units are adapted for updating the stored voltage level by switching a stage of at least one of the latch flip flop units, and holding the state as long as no reset signal is received.

7. The apparatus of claim 6, wherein said plurality of latch flip flop units are adapted for outputting said digital code each time a voltage level is updated.

8. The apparatus of claim 4, wherein said plurality of latch flip flop units are capable of being reset by receiving said reset signal, and are further adapted for holding a reset state of the latch flip flop units until a new voltage level is stored.

9. The apparatus of claim 1, wherein said voltage level detection unit comprises a plurality of threshold switches each adapted for detecting if said voltage level of said input voltage exceeds a predefined threshold voltage of the respective threshold switch.

10. The apparatus of claim 9, wherein said threshold switches are Schmitt-Trigger devices.

11. The apparatus of claim 9, wherein said voltage level detection unit comprises a reference divider and a reference voltage source connected to supply a reference voltage to said reference divider for generating said threshold voltages.

12. The apparatus of claim 1, wherein said voltage level detection unit comprises a plurality of comparators connected to receive said input voltage and further connected to receive respective reference voltages for comparing said input voltage with said reference voltages.

13. The apparatus of claim 12, wherein said voltage level detection unit comprises a reference divider and a reference voltage source connected to supply a reference voltage to said reference divider for generating said reference voltages.

14. The apparatus of claim 1, comprising a rectifier connected to receive said analog voltage, wherein said rectifier is further connected to the voltage level detection unit for delivering a rectified analog voltage as said input voltage.

15. The apparatus of claim 14, wherein said rectifier comprises a diode and a current source adapted for generating a bias current for keeping said diode at a given operating point.

16. The apparatus of claim 1, comprising an absolute value generator connected to receive said analog voltage, wherein said voltage level detection unit is connected to said absolute value generator to receive absolute values of said analog voltage as said input voltage.

17. The apparatus of claim 16, wherein said absolute value generator comprises a diode bridge circuit.

18. The apparatus of claim 1, comprising a decoder unit connected to said digital memory to receive said digital code for generating a digital output signal of the apparatus.

19. The apparatus of claim 1, adapted for being operated in an RF (Radio Frequency) transceiver.

20. An integrated circuit chip having circuitry for measuring a peak value of an analog voltage, the integrated circuit chip comprising an analog to digital converter circuit connected to receive an input voltage, said analog to digital converter circuit comprising:

a voltage level detection circuit adapted to detect a voltage level of a received input voltage; and a digital memory circuit connected to the voltage level detection circuit for receiving and storing a detected voltage level;

wherein said digital memory circuit is adapted for updating a stored voltage level by a currently detected voltage level only if the currently detected voltage level is higher than the stored voltage level, or updating the stored voltage level by a currently detected voltage level only if the currently detected voltage level is lower than the stored voltage level;

wherein said digital memory circuit is capable of outputting a digital code corresponding to the stored voltage level.

21. A WLAN (Wireless Local Area Network) receiver having a voltage peak measurement device for measuring a peak value of an analog voltage, the device comprising an analog to digital converter connected to receive an input voltage, said analog to digital converter comprising:

a voltage level detection unit adapted to detect a voltage level of a received input voltage; and a digital memory connected to the voltage level detection unit for receiving and storing a detected voltage level;

wherein said digital memory is adapted for updating a stored voltage level by a currently detected voltage level only if the currently detected voltage level is higher than the stored voltage level, or updating the stored voltage level by a currently detected voltage level only if the currently detected voltage level is lower than the stored voltage level;

wherein said digital memory is capable of outputting a digital code corresponding to the stored voltage level.

22. A method of measuring a peak value of an analog voltage, the method comprising:

receiving an input voltage in an analog to digital converter;

detecting a voltage level of a received input voltage;

storing a detected voltage level in a digital memory; and outputting a digital code corresponding to a stored voltage level, wherein the stored voltage level is updated by a currently detected voltage level only if the currently detected voltage level is higher than the stored voltage level, or is updated by a currently detected voltage level only if the currently detected voltage level is lower than the stored voltage level.

23. The method of claim 22, further comprising:

resetting said digital memory when receiving a reset signal.

24. The method of claim 22, further comprising:

determining whether a rising edge of a reset signal is received, wherein outputting a digital code is performed in response to receiving the rising edge of the reset signal.

25. The method of claim 23, wherein resetting said digital memory comprises:

receiving said reset signal;

resetting a plurality of latch flip flop units; and holding the reset state of the latch flip flop units until a new voltage level is to be stored.

26. The method of claim 22, wherein storing the detected voltage level comprises:

operating at least one latch flip flop unit.

27. The method of claim 22, further comprising:

switching a state of at least one of a plurality of latch flip flop units corresponding to said input voltage, and holding the states of the latch flip flop units as long as no reset signal is received.

28. The method of claim 27, further comprising:

updating the stored voltage level in said plurality of latch flip flop units.

29. The method of claim 28, wherein updating the stored voltage level comprises:

switching a state of at least one of the latch flip flop units corresponding to said input voltage, and holding the states of the latch flip flop units as long as no reset signal is received.

30. The method of claim 29, wherein updating the stored voltage level comprises:

outputting a digital code representing said voltage level, after updating said voltage level.

31. The method of claim 22, wherein detecting a voltage level comprises:

operating a plurality of threshold switches each adapted for detecting if said voltage level of said input voltage exceeds a predefined threshold voltage of the respective threshold switch.

32. The method of claim 22, wherein detecting a voltage level comprises:

generating reference voltages for defining reference voltage levels by operating a reference divider.

33. The method of claim 22, wherein detecting a voltage level comprises:

operating of a plurality of comparators each adapted for comparing said input voltage with generated reference voltages.

34. The method of claim 22, further comprising:

rectifying said analog voltage and delivering a rectified analog voltage as said input voltage to said analog to digital converter.

35. The method of claim 34, wherein rectifying comprises:

operating a diode and a current source for generating a bias current for keeping said diode at a given operation point.

36. The method of claim 22, further comprising:

generating an absolute value of said analog voltage and delivering said absolute value as said input signal to said analog to digital converter.

37. The method of claim 36, wherein generating an absolute value comprises:

operating a diode bridge circuit.

38. The method of claim 22, further comprising:

decoding said digital code.

39. The method of claim 22, adapted for being operated in an RF (Radio Frequency) transceiver.

* * * * *